United States Patent
Lu et al.

(10) Patent No.: US 9,748,949 B1
(45) Date of Patent: Aug. 29, 2017

(54) GATE DRIVE CIRCUIT FOR POWER CONVERSION APPARATUS

(71) Applicant: Hella KGaA Hueck & Co., Lippstadt (DE)

(72) Inventors: Juncheng Lu, Flint, MI (US); Hua Bai, Flint, MI (US)

(73) Assignee: Hella KGaA Hueck & Co., Lippstadt (DE)

( * ) Notice: Subject to any disclaimer, the term of this patent is extended or adjusted under 35 U.S.C. 154(b) by 0 days.

(21) Appl. No.: 15/287,144

(22) Filed: Oct. 6, 2016

Related U.S. Application Data (60) Provisional application No. 62/365,157, filed on Jul. 21, 2016.

(51) Int. Cl.
| | |
|---|---|
| H03B 1/00 | (2006.01) |
| H03K 3/00 | (2006.01) |
| H03K 17/60 | (2006.01) |
| H01L 27/06 | (2006.01) |
| H01L 29/778 | (2006.01) |
| H01L 29/20 | (2006.01) |
| H03K 17/687 | (2006.01) |
| H02M 3/337 | (2006.01) |

(52) U.S. Cl.
CPC ....... *H03K 17/602* (2013.01); *H01L 27/0605* (2013.01); *H01L 27/0629* (2013.01); *H01L 27/0635* (2013.01); *H01L 29/2003* (2013.01); *H01L 29/7787* (2013.01); *H02M 3/3376* (2013.01); *H03K 17/6872* (2013.01)

(58) Field of Classification Search
CPC .............. H03K 17/602; H03K 17/6872; H01L 27/0605; H01L 27/0629; H01L 27/0635
USPC ........ 327/108–112, 427, 434, 437, 374, 376, 327/377; 326/82, 83, 87
See application file for complete search history.

(56) References Cited

U.S. PATENT DOCUMENTS

| | | |
|---|---|---|
| 6,172,550 B1 | 1/2001 | Gold et al. |
| 7,965,126 B2 | 6/2011 | Honea et al. |
| | (Continued) | |

FOREIGN PATENT DOCUMENTS

| | | |
|---|---|---|
| JP | WO2013150567 | 10/2013 |

OTHER PUBLICATIONS

"How to Drive GaN Enhancement Mode Power Switching Transistors", GaN Systems, Inc., pp. 1-13, Oct. 21, 2014.
(Continued)

*Primary Examiner* — Thomas Skibinski
(74) *Attorney, Agent, or Firm* — Dykema Gossett PLLC (57) ABSTRACT

An apparatus includes a gate drive circuit and a GaN HEMT switch where the gate drive circuit has a gate drive output to produce a gate drive signal in response to a gate control signal. The switch has a gate connected to the gate drive circuit through a gate drive resistor. The gate drive circuit includes a NPN (or NMOS) turn-on transistor and a PNP (or PMOS) turn-off transistor. The gate drive circuit includes a turn-on resistor with a first resistance coupled to the turn-on transistor and a turn-off resistor with a second resistance coupled to the turn-off transistor. The turn-on and turn-off transistors, gate drive resistor, the switching device, but not the turn-on and turn-off resistors are disposed in an integrated circuit to reduce a gate-drive loop inductance. The first and second resistances can be different to adjust the turn-on and turn-off speeds of the switching device.

18 Claims, 9 Drawing Sheets

(56) References Cited

U.S. PATENT DOCUMENTS

| | | |
|---|---|---|
| 9,484,908 B1 | 11/2016 | Lu et al. |
| 2002/0125920 A1 | 9/2002 | Stanley |
| 2007/0035481 A1* | 2/2007 | Kim ................ G09G 3/296 |
| | | 345/68 |
| 2008/0122497 A1* | 5/2008 | Ishikawa .......... H03K 17/567 |
| | | 327/108 |
| 2009/0201072 A1* | 8/2009 | Honea .......... H03K 17/08142 |
| | | 327/424 |
| 2013/0321038 A1 | 12/2013 | Zhao |
| 2014/0225163 A1 | 8/2014 | Briere |
| 2015/0014698 A1 | 1/2015 | Briere |
| 2015/0116024 A1 | 4/2015 | Ishikawa et al. |
| 2015/0256155 A1 | 9/2015 | Haeberlen |

OTHER PUBLICATIONS

Lidow, et al., "eGaN FET Drivers and Layout Considerations", EPC Efficient Power Conversion, White Paper: WP008, pp. 1-7, 2012.
Bai et al., "Design of an 11 kW power factor correction and 10 kW ZVS DC/DC converter for a high-efficiency battery charger in electric vehicles," IET Power Electronics, pp. 1-9, Sep. 18, 2012.
"LM 5113 100 V 1.2-A /5-A, Half-Bridge Gate Driver for Enhancement Mode GaN FETs", Texas Instruments, 26 pgs., Jun. 2011.

\* cited by examiner

GATE DRIVE CIRCUIT FOR POWER CONVERSION APPARATUS

CROSS-REFERENCE TO RELATED APPLICATIONS

This application claims the benefit of U.S. provisional application No. 62/365,157, filed 21 Jul. 2016 (the '157 application), which '157 application is hereby incorporated by reference as though fully set forth herein.

BACKGROUND a. Technical Field

The instant disclosure relates generally to power electronics systems, and more particularly to a gate driver circuit for power conversion apparatus.

b. Background

This background description is set forth below for the purpose of providing context only. Therefore, any aspects of this background description, to the extent that it does not otherwise qualify as prior art, is neither expressly nor impliedly admitted as prior art against the instant disclosure.

In a power electronics circuit, a so-called gate driver circuit is important and challenging to design because of the electrical stress incurred by the subject switching device being controlled by the driver circuit during the switching process. For example, an electrical voltage stress affects the subject switching device during the switching off process while an electrical current stress takes place during the switching on process. In some applications, a different switching speed for switching ON versus switching OFF may be desired and/or implemented. In particular, switching speed usually determines the switching loss. The faster the switching speed, the lower the switching loss thereby the higher the switching frequency. On the other hand, that means at the same loss level, the faster-switching-speed semiconductor yields to higher switching frequency, which results in the smaller passive components thereby a higher power density. For the conventional Si IGBTs, for example, the switching speed may be about >100 nanoseconds (ns) to turn on/off, while for a GaN device, such value may drops to ~10 ns, which means the switching loss is ~1/10 of the conventional Si devices. This will yield to much higher efficiency or 10 times higher power density.

The mechanism implemented by the gate driver circuit involves charging and discharging the input capacitance $C_{iss}$ of the switching device being controlled. In theory, different switching speeds and turn-on/turn-off times means different impedances of a gate-drive loop.

In addition, wide-bandgap (WBG) devices, such as Silicon Carbide (SiC) and Gallium Nitride (GaN) devices are becoming more popular due to their higher switching frequency capability, lower switching loss and higher thermal capability as compared to conventional silicon (Si) devices. In the case of an enhancement-mode GaN HEMT, it may be appreciated that the parasitic capacitance is much smaller than for traditional silicon devices (e.g., ~pF level). This reduced level allows faster switching speed; however, this characteristic also requires increased care to control and reduce the gate-drive loop inductance in order to minimize undesirable side effects, such as induced ringing of the gate voltage.

Accordingly, there is therefore a need to overcome one or more of the problems in the art.

The foregoing discussion is intended only to illustrate the present field and should not be taken as a disavowal of claim scope.

SUMMARY

Embodiments consistent with the present teachings realize an integrated gate drive circuit and power switching device, such as a WBG switching device (e.g., GaN HEMT) that reduces a gate-drive loop inductance. This reduction has a number of advantages, including at least reducing ringing on a switching device gate terminal. In addition, embodiments consistent with the present teachings provide improved flexibility in adjusting switching speed (e.g., by allowing separate turn-on and turn-off timing adjustments), for example, suitable for use in a power conversion apparatus.

An apparatus according to the instant disclosure includes a gate drive circuit and a wide-bandgap switching device, such as GaN HEMT device, in an embodiment. The gate drive circuit has at least one gate drive output configured to produce a gate drive signal in response to a gate control signal applied to an input of the gate drive circuit. The wide-bandgap (WBG) switching device has a gate, a drain, and a source wherein the gate is electrically connected to the gate drive circuit through a gate drive resistor. The drain and the source may be configured to be electrically coupled to a load (e.g., and/or a source and/or a load, or other external circuitry, as known in the art).

The gate drive circuit includes a turn-on transistor and a turn-off transistor that are selected from one of (i) a pair of bipolar junction transistors (BJT), and (ii) a pair of CMOS gate-drive field-effect transistors. The gate drive circuit further includes a turn-on resistor having a first resistance coupled to the turn-on transistor and a turn-off resistor having a second resistance coupled to the turn-off transistor. In an embodiment, the turn-on transistor is disposed in the electrical current path for a switching on process while the turn-off resistor is disposed in the electrical current path for the switching off process. In an embodiment, the first resistance can be different than the second resistance to adjust switching speeds.

The foregoing and other aspects, features, details, utilities, and advantages of the present disclosure will be apparent from reading the following description and claims, and from reviewing the accompanying drawings.

DETAILED DESCRIPTION

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments, the scope of which is defined solely by the appended claims.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

The present teachings pertain to an improved gate drive circuit that can be usefully applied to a wide variety of applications, including, for example only, a high frequency power converter as seen by reference to U.S. application Ser. No. 15/198,887, filed 30 Jun. 2016 (the '887 application) entitled "ELECTRIC POWER CONVERSION APPARATUS HAVING SINGLE-PHASE AND MULTI-PHASE OPERATION MODES" which '887 application is hereby incorporated by reference as though fully set forth herein.

Before proceeding to a detailed description of an improved gate drive circuit in connection with FIGS. 6-10, a brief description will first be set forth of an exemplary power conversion apparatus in which embodiments of the instant gate drive circuit may be used.

Figure 1:
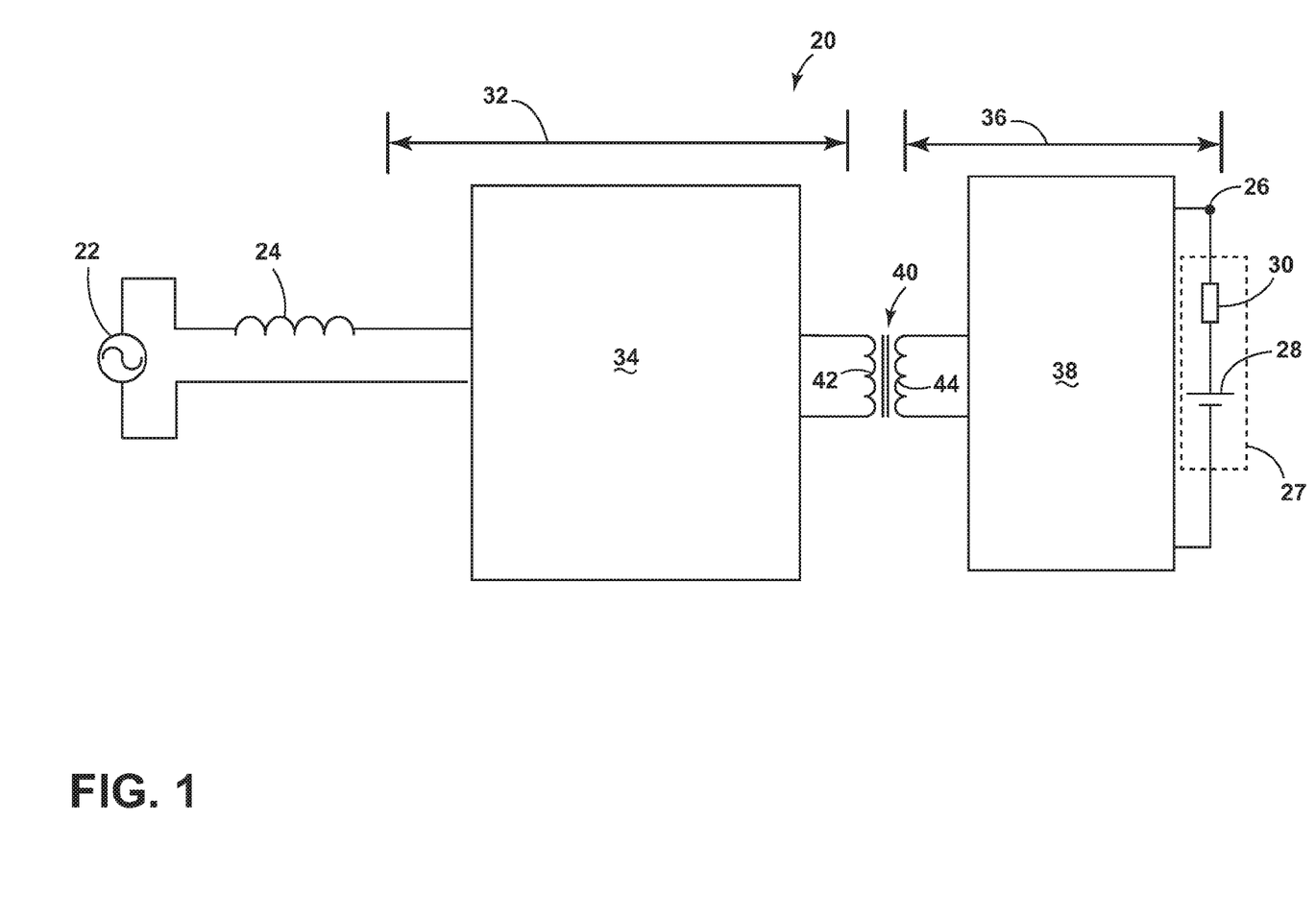
FIG. 1 is a schematic and block diagram of an isolated AC/DC electric power converter in which a gate drive circuit embodiment according to the present teachings may be used.

Referring now to the drawings wherein like reference numerals are used to identify identical or similar components in the various views, FIG. 1 is simplified schematic and block diagram of an isolated AC/DC electric power conversion apparatus 20 (hereinafter "conversion apparatus"). The conversion apparatus 20 of FIGS. 1-2 may employ an improved gate drive circuit and/or integrated gate drive circuit/switch, as described in detail in FIGS. 6-10. Embodiments of such a gate drive circuit can provide improved flexibility in regard to switching speed flexibility. In further embodiments, increased levels of integration of the gate drive circuit and a WBG switching device (e.g., GaN HEMT) can reduce a gate drive loop inductance, which in turn can reduce ringing on the gate terminal and its related side effects.

In the illustrated embodiment, the conversion apparatus 20 is coupled to an AC input power source 22 and has an input inductor 24 configured to smooth the grid-side current. The conversion apparatus 20 is further configured to output a DC voltage signal on an output node 26, which can be used to charge a re-chargeable battery 27, such as an electric vehicle (EV) battery, for example only. The battery 27 is shown to include a battery voltage source portion 28 (sometimes referred to herein as $V_b$ or $V_{BAT}$) and a battery resistance 30 (sometimes referred to herein as $R_b$). The AC source 22 (AC power source) is configured to provide an AC input current at a specified AC input voltage level. The AC source 22 may be a main AC power supply or electrical system for a building or the like provided within an overall larger AC electric power grid (hereinafter sometimes referred to as grid power, grid voltage, grid-side, etc.). The AC source 22 may be single-phase or multi-phase (e.g., 3-phase). Depending on location, the AC source 22 may output 120 volts or 240 volts at 60 Hz, 110 volts or 220 volts at 50 Hz, or 380-480 volts at 50 Hz (3-phase power). The voltage $V_b$ of re-chargeable battery 27 may be nominally between about 200-500 VDC. In an embodiment, the conversion apparatus 20 may have an output voltage of about 360 V.

The conversion apparatus 20 includes two main stages, wherein a first stage 32 comprises an AC/AC converter 34 and a second stage 36 comprises an AC/DC rectifier 38. The stages are electrically isolated but coupled by way of a transformer 40 having a primary winding 42 and a secondary winding 44.

The first stage 32 may comprise an indirect matrix converter (MC) as the AC/AC converter 34, and may comprise conventional approaches for constructing the same as known in the art. It should be understood, however, that converter 34 may comprise a true matrix converter. The indirect matrix converter type AC/AC converter 34 has minimal energy storage requirements, which eliminates the need for bulky and lifetime-limited energy-storing capacitors, and exhibits improved efficiency, for example, by merging three-stages as known in the art (see Background) down to two-stages, and as seen by reference to U.S. patent application Ser. No. 14/789,412, filed 1 Jul. 2016, (hereinafter the '412 application, entitled "ELECTRIC POWER CONVERSION APPARATUS"), which '412 application is hereby incorporated by reference as though fully set forth herein. Eliminating the DC-bus capacitor can also increase the power density of the overall apparatus.

Figure 2:
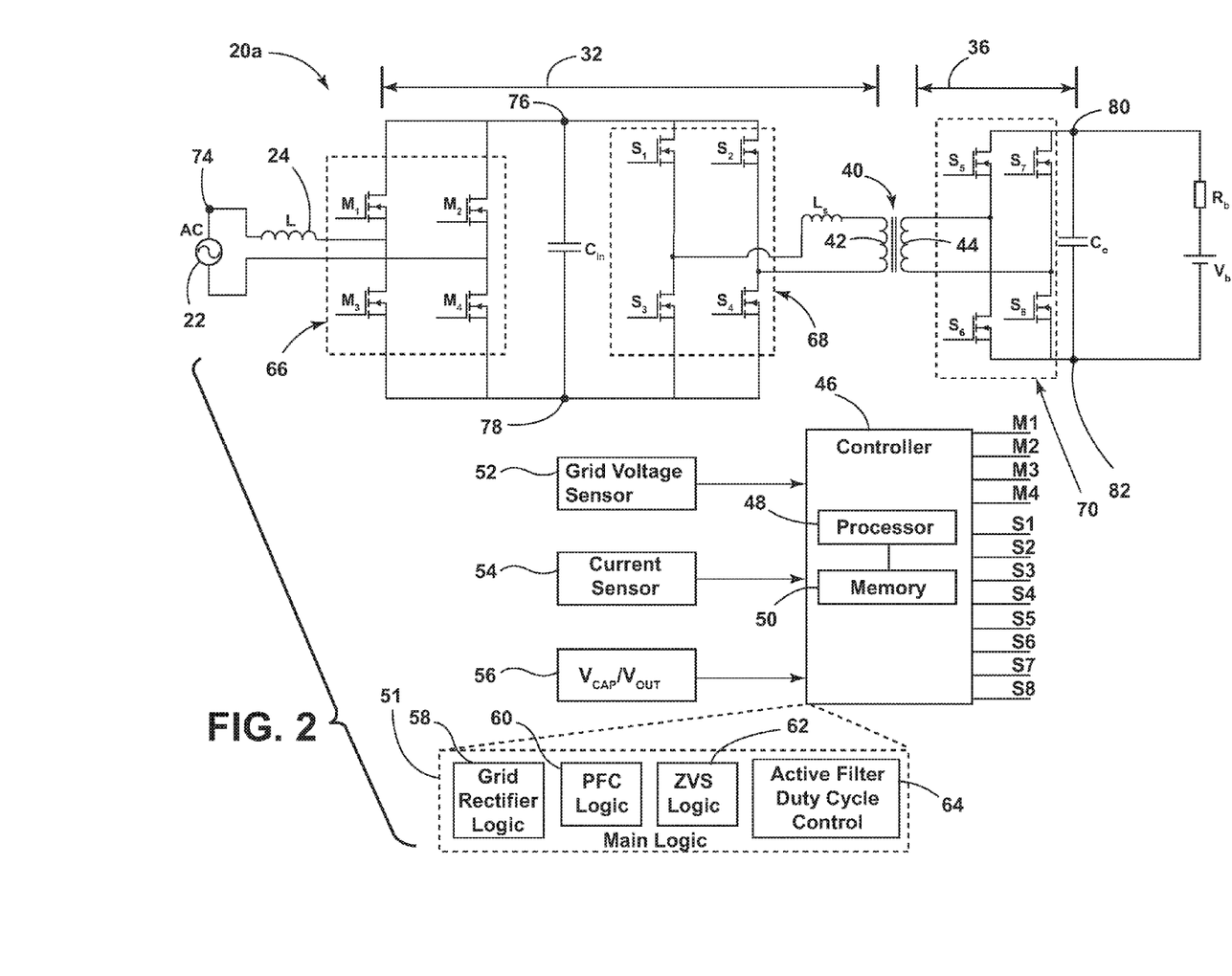
FIG. 2 is diagrammatic schematic and block diagram of an isolated AC/DC electric power converter in which a gate drive circuit embodiment according to the present teachings may be used.

FIG. 2 shows an electric power conversion apparatus, designated 20a, that features an indirect matrix converter. Conversion apparatus 20a includes two main stages, namely, a first stage 32 that includes an AC/AC converter in the form of an indirect matrix converter and a second stage 36 that includes an AC/DC rectifier part 36.

On the input (grid) side, FIG. 2 shows AC (grid) source 22, which may be a single-phase, 60 Hz, 120 volt alternating current (AC) voltage signal or alternately a single-phase 50 Hz AC signal, or a multi-phase (e.g., 3-phase) alternating current (AC) source. On the output (battery) side, FIG. 2 shows a rechargeable battery $V_b$ with battery resistance $R_b$.

The first stage 32 includes an input inductor 24 (sometime referred to as "L"), an indirect matrix converter, a coupling inductor $L_s$, and transformer 40, which includes primary windings 42 and secondary windings 44.

The input inductor 24 is electrically coupled in series with AC source 22 and is configured to smooth the grid-side current in respect of AC source 22. The size of inductor 24 will depend on the degree of smoothing and the switching frequency. In an embodiment, inductor 24 may be about 10 micro-henry (µH).

In an embodiment, the indirect matrix converter includes a full bridge rectifier 66 (AC/DC converter), a filter capacitor designated $C_{in}$, and a DC/AC full bridge converter 68. The indirect matrix converter is configured for AC/AC conversion and further includes an input interface configured to receive a first AC signal from AC source 22 and an output interface configured to produce a second AC signal. As shown in FIG. 2, the input interface of the indirect matrix converter is coupled to both sides of the AC source 22 through inductor 24. The output interface of the indirect matrix converter is coupled to both ends of the primary winding 42 through the coupling inductor $L_s$.

Full bridge rectifier 66 constitutes a means for rectifying the first alternating current (AC) input signal at node 74 (i.e., which presents at a first, grid frequency, for example, 60 Hz) and producing a first rectified output signal at node 76. The first rectified signal includes a first direct current (DC) component. Rectifier 66 may include four semiconductor switches, designated $M_1$, $M_2$, $M_3$, $M_4$, arranged in a full bridge configuration and operating at the grid frequency. The switches $M_1$, $M_2$, $M_3$, $M_4$ may comprise conventional semiconductor switches known in the art, such as MOSFET or IGBT devices. In an embodiment, the switches $M_1$, $M_2$, $M_3$, $M_4$ may comprise an N-Channel power MOSFET provided under the trade designation and/or part number STY139N65M5 from STMicroelectronics, Coppell, Tex., USA.

Capacitor $C_{in}$ is connected across the output of rectifier 66, between node 76 and a ground node 78. Capacitor $C_{in}$ is configured in size to filter high-frequency harmonics from the rectified signal at node 76 (e.g., relatively small: ~uF level). It should be understood that $C_{in}$ is not used for energy storage, but is rather used for filtering purposes, and is thus not a large, bulky DC-bus capacitor as is typical for conventional 3-stage converters where the DC-bus capacitor may be on the order of millifarads (~mF). This reduced size in $C_{in}$ can increase the power density and extend the service life of the conversion apparatus 20a.

The DC/AC converter 68 is electrically connected to the output of rectifier 66 (i.e., connected across nodes 76, 78). The DC/AC converter 68 is configured to convert the first DC (rectified) signal on node 76 into a second AC signal. As illustrated, DC/AC converter 68 may comprise four semiconductor switches, designated $S_1$, $S_2$, $S_3$, $S_4$, and arranged in a full bridge configuration operating at a second frequency, namely, a switching frequency $f_s$. The second, switching frequency $f_s$ is generally much higher than the first, grid frequency. In an embodiment, the second, switching frequency may be in a range of between about 135 kHz to 500 kHz, while the first, grid frequency may be 60 Hz (or 50 Hz). The semiconductor switches $S_1$, $S_2$, $S_3$, $S_4$ may comprise commercially available components known in the art, for example only, a GaN High Electron Mobility Transistor (HEMT) device, such as an enhancement mode GaN transistor provided under the trade designation and/or part number GS66516T from GaN Systems Corp., Ann Arbor, Mich., USA.

Inductor $L_s$ is electrically connected in series between the DC/AC converter 68 and primary winding 42.

Transformer 40 constitutes an electrical isolation device and includes a primary winding 42 and an electrically isolated and magnetically coupled secondary winding 44. As known, transformer 40 is characterized by a turn ratio between the secondary winding and the primary winding.

The second stage 36 of conversion apparatus 20a includes an AC/DC converter 70 and an output capacitor designated $C_o$.

AC/DC converter 70 is electrically connected to the second winding 44 of transformer 40 and is configured to convert or rectify the AC signal induced on the secondary winding 44 to a second rectified output signal on output node 80. The output signal produced on the output node 80 from the single phase conversion device 20a has a DC component and at least one AC component, wherein the at least one AC component includes a second order harmonic of the grid frequency (e.g., a 120 Hz components for a 60 Hz grid frequency).

In the illustrated embodiment, the AC/DC converter 70 may comprise four semiconductor switches, designated switches $S_5$, $S_6$, $S_7$, $S_8$, arranged in an active H-bridge (full) switching arrangement 70. In an embodiment, H-bridge switching arrangement 70 is controlled to operate at the above-mentioned switching frequency $f_s$ (i.e., switches $S_1$~$S_8$ are controlled to operate at the same switching frequency $f_s$). The semiconductor switches $S_5$, $S_6$, $S_7$, $S_8$, may comprise commercially available components, for example, a GaN High Electron Mobility Transistor (HEMT) device, such as an enhancement mode GaN transistor provided under the trade designation and/or part number GS66516T from GaN Systems Corp., Ann Arbor, Mich., USA.

Output capacitor $C_o$ is connected across the output of H-bridge 70 between output node 80 and an output ground node 82 and is configured in size to filter high-frequency harmonics from the output signal at node 80 (e.g., relatively small: ~uF level). In an embodiment, capacitor $C_o$ may be about 100 µF.

Conversion apparatus 20a further includes an electronic control unit 46 (hereinafter controller 46) configured to implement a desired control strategy for the operation of conversion apparatus 20a. Controller 46 includes a processor 48 and a memory 50. Processor 48 may include processing capabilities as well as an input/output (I/O) interface through which processor 48 may receive a plurality of input signals and generate a plurality of output signals (e.g., gate drive signals for switches $M_1$~$M_4$ and $S_1$~$S_8$). Memory 50 is provided for storage of data and instructions or code (i.e., software) for processor 48. Memory 50 may include various forms of non-volatile (i.e., non-transitory) memory including flash memory or read only memory (ROM) including various forms of programmable read only memory (e.g., PROM, EPROM, EEPROM) and/or volatile memory including random access memory (RAM) including static random access memory (SRAM), dynamic random access memory (DRAM) and synchronous dynamic random access memory (SDRAM).

Although not shown in FIG. 2, conversion apparatus 20a may also include a driver circuit to interface between the outputs of controller 46 and the gate terminals of the semiconductor switches. In an embodiment, such gate drive devices/circuits may comprise commercially available components, such as a commercially available chip known in the art, for example, a gate drive chip available under part number IXD_614 from IXYS Corporation, Milpitas, Calif., USA. However, in other embodiments consistent with the present teachings, an improved gate drive circuit described below in connection with FIGS. 6-10 may be used, particularly in connection with the above-mentioned GaN switching devices.

Memory 50 stores executable code in the form of main control logic 51, which is configured to control the operation of conversion apparatus 20a in accordance with a desired control strategy. Main control logic 51, when executed by processor 48, is configured to generate, in response to one or more input signals, the various gate drive signals for the switches $M_1$~$M_4$ and $S_1$~$S_8$. Main control logic 51 may include programmed logic blocks to implement specific functions, including without limitation rectifier logic 58, power factor correction (PFC) logic 60, zero voltage switching (ZVS) logic 62, and, optionally, active filter duty cycle control logic 64 as seen by reference to U.S. application Ser. No. 15/198,887, filed 30 Jun. 2016 (the '887 application) entitled "ELECTRIC POWER CONVERSION APPARATUS HAVING SINGLE-PHASE AND MULTI-PHASE OPERATION MODES" which '887 application is hereby incorporated by reference as though fully set forth herein.

The grid rectifier logic 58 is configured to generate the gate drive signals for switches $M_1$~$M_4$ of rectifier 66. To accomplish this, conversion apparatus 20a may include a grid voltage sensor 52 (shown in block form) configured to output a signal indicative of a grid voltage, including a polarity (i.e., positive or negative). The voltage sensor 52 may be disposed on the grid side (i.e., electrically connected to AC source 22) to monitor the grid voltage. In an embodiment, grid voltage sensor 52 may comprise conventional components known in the art.

Figure 3:
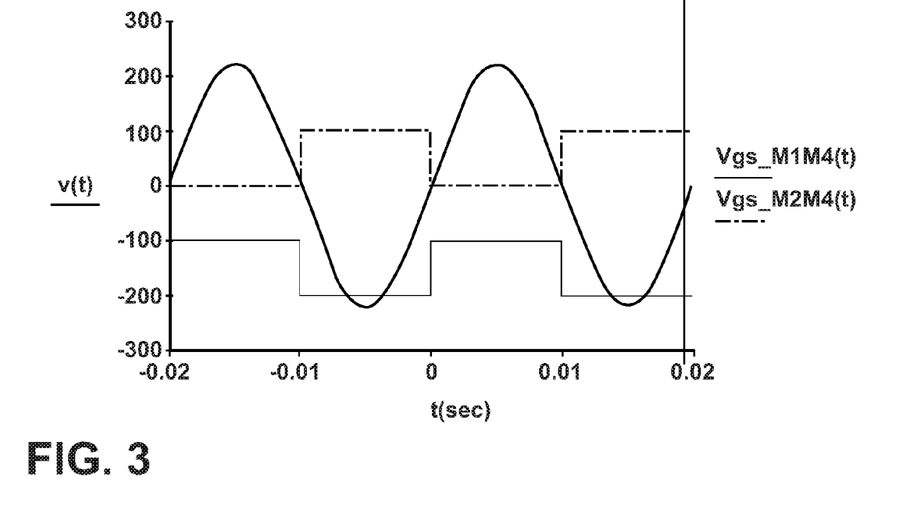
FIG. 3 shows simplified, timing diagrams of a first set of switch control signals associated with a full bridge based AC/DC rectifier of FIG. 2.

FIG. 3 shows timing diagrams of the gate drive signals (i.e., switch control signals) produced by the grid rectifier logic 58 of controller 46. The $M_1$~$M_4$ based H-bridge rectifier 66 will rectify the grid AC voltage into a DC voltage. The switching frequency of $M_1$~$M_4$ is the same as the grid voltage (e.g., 50~60 Hz). Note, that $M_1$~$M_4$ are controlled by the detecting the polarity of the grid voltage. Thus, when the grid voltage is positive, $M_1$ and $M_4$ are turned on (i.e., the $V_{GS}$ of $M_1$ and $M_4$ is high). When the grid voltage is negative, $M_2$ and $M_3$ are turned on. The gate drive signals for switches $M_1$ and $M_4$ operate in unison while switches $M_2$ and $M_3$ operate in unison. Additionally, the combination of $M_1M_4$ are complementary to the combination of $M_2M_3$. In sum, the switches $M_1$~$M_4$ are all active switches working at the grid frequency, e.g., 60 Hz, as per the zero transitions of the grid voltage sensor 52 output.

Referring again to FIG. 2, power factor correction (PFC) control logic 60 is configured, in general, to manage the operation (i.e., conduction or non-conduction) of the switches $S_1$~$S_8$ in such a way so as to control the instantaneous current from AC source 22 so as to be in phase with the instantaneous voltage of the AC source 22. To achieve a unity or near unity power factor (i.e., a condition where the grid side voltage and current are in phase), conversion apparatus 20a includes a grid current sensor 54. In an embodiment, the current sensor 54 is configured to determine the current through inductor 24, and provide a signal to controller 46 that indicates the level of electrical current being drawn from AC source 22. This signal is thus a grid current indicative signal. In an embodiment, controller 46 through PFC logic 60 implements power factor correction by controlling the gate drive signals for switches $S_1$~$S_8$. This will be described in greater detail below. Grid current sensor 54 may comprise conventional components known in the art.

Zero voltage switching (ZVS) logic 62 is configured, in general, to manage the switches $S_1$~$S_8$ in such a way so that they are turned on and off preferably with a zero or a near zero voltage. Generally, in order to maintain zero voltage switching for switch turn-on, before the turning on action, current should reverse flow from the source to drain, which makes the switch voltage drop to zero. Thus, during the switch turn on, the switch only undertakes the current change with a voltage then-prevailing across the drain to source of the switch always being close to be zero, which in turn eliminates the turn-on loss to thereby reach the ZVS turn on. For more information, reference may be made to U.S. application Ser. No. 14/744,998, filed 19 Jun. 2015 (hereinafter the '998 application, entitled "GATE DRIVE CIRCUIT"), which '998 application is hereby incorporated by reference as though fully set forth herein.

Figure 4:
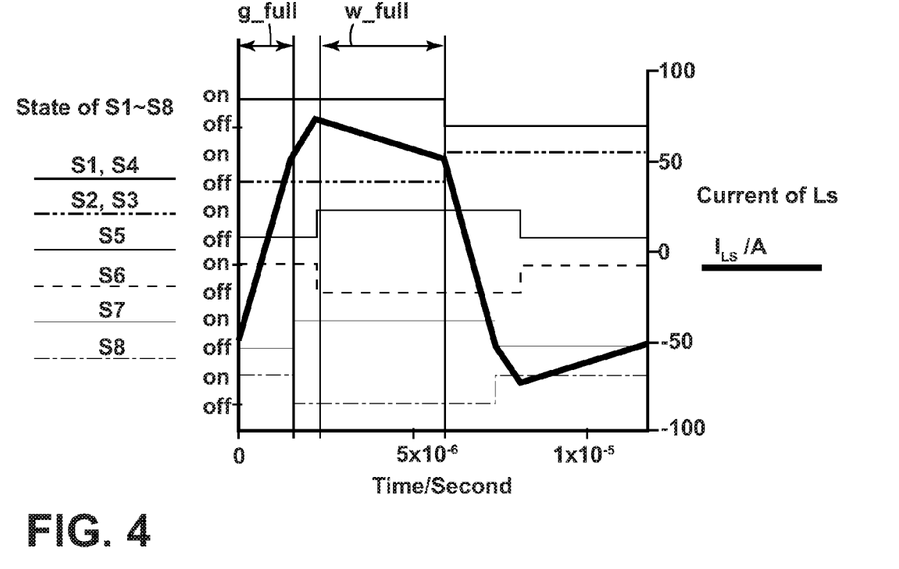
FIG. 4 shows simplified, timing diagrams of a second set of switch control signals to control the operation of the grid-side DC/AC converter and the battery-side AC/DC rectifier (H-bridge) of FIG. 2.

FIG. 4 shows timing diagrams of the gate drive signals (i.e., a second set of switch control signals) to control the operation of switches $S_1$~$S_8$, in a single switching frequency embodiment. In the illustrated embodiment, $S_1$~$S_8$ will be operated at the same switching frequency $f_s$ with 50% duty cycle. To achieve the high system power density, the switching frequency $f_s$ should be as high as possible. The gate drive signals for $S_1$ and $S_2$, $S_3$ and $S_4$, $S_5$ and $S_6$, and $S_7$ and $S_8$, are complementary. The main control logic 51 is configured to introduce a phase shift between the gate drive signals for $S_5$ and $S_7$. Plural factors, including the switching frequency $f_s$ and the determined phase shift between $S_5$ and $S_7$, together determine the power transferred from the primary side of transformer 40 to the secondary side. In other words, the above-mentioned factors provide two (2) degrees of freedom to control the transferred power. Meanwhile, in order to achieve ZVS, the $S_5$-to-$S_7$ phase shift must fall into a certain range, which restricts the switching frequency $f_s$ to a certain value as well. In FIG. 4, the current through inductor $L_s$ is also shown, in timed relationship to the states of switches $S_1$~$S_8$.

Figure 5:
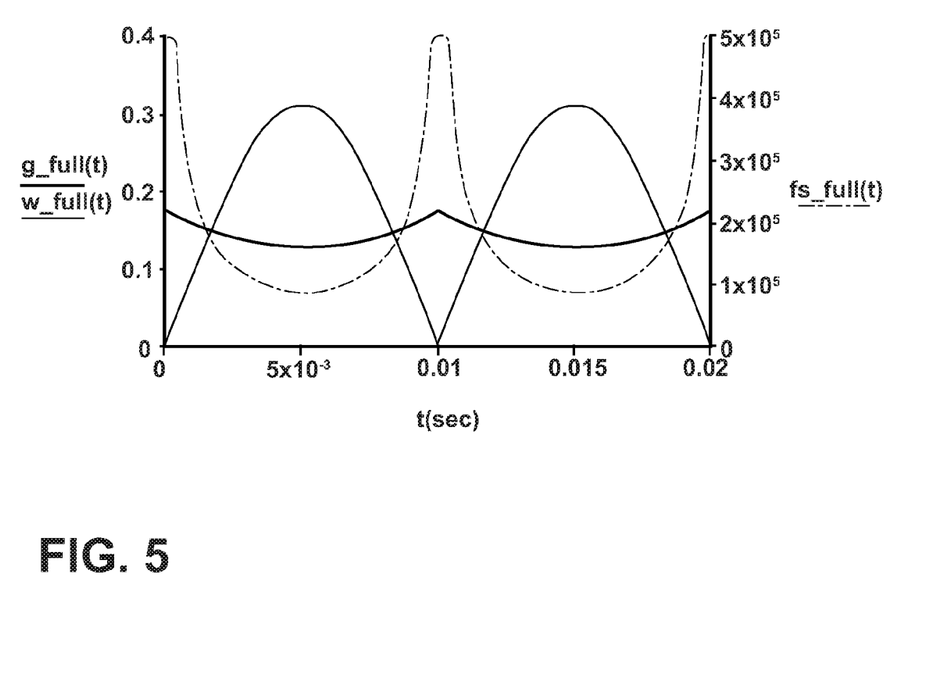
FIG. 5 is a timing diagram of parameters for determining switch timing in FIG. 4.

The main control logic 51, in compliance with PFC logic 60 and ZVS logic 62, determine at least two parameters, designated g_full and w_full in FIGS. 4-5. The g_full parameter corresponds to a time delay between $S_2$ and $S_8$ falling edges, while the w_full parameter corresponds to a time delay between $S_1$ and $S_6$ falling edges. The $S_5$-to-$S_7$ phase shift is defined in between g_full and w_full, as graphically shown in FIG. 4.

FIG. 5 is a timing diagram showing waveforms of the above-described g_full and w_full parameters, which are the two parameters used by controller 46 to determine the phase shift between $S_5$ and $S_7$. The parameter fs_full corresponds to the switching frequency $f_s$.

In an embodiment, the main control logic 51 is executed by controller 46 wherein the functions of rectifier logic 58, PFC logic 60, and ZVS logic 62 are realized concurrently. In this regard, the w_full parameter may be determined by controller 46 in accordance with eqn. (1):

$$\text{w\_full}(t) := \frac{0.5 \cdot (|v(t)| - 2 \cdot \text{g\_full}(t) \cdot |v(t)|)}{V2 \cdot \text{n\_full}} \quad \text{Equation (1)}$$

where V(t) is measured voltage on the grid side of converter 20a (i.e., input node 74—FIG. 2), V2 is the measured output voltage of the converter at node 80, and n_full is turn ratio of the transformer 40 (i.e., $N_s/N_p$, where $N_s$ is the number of secondary turns and $N_p$ is the number of primary turns). The parameter g_full in Equation (1) is determined by system designer to achieve ZVS switching. In an embodiment, g_full=0.5 (gmin+gmax), where the functions of gmin and gmax are as set forth in Equations (2) and (3) below:

$$\text{gmin\_full}(t) := \frac{2\text{Is\_full} \cdot Lf \cdot fsa}{|v(t)| + V2 \cdot \text{n\_full}} \quad \text{Equation (2)}$$

$$\text{gmax\_full}(t) := \frac{V2^2 \cdot \text{n\_full}^2 - V2 \cdot \text{n\_full} \cdot |v(t)| + 2 \cdot (|v(t)|)^2}{4 \cdot V2^2 \cdot \text{n\_full}^2 + 4 \cdot (|v(t)|)^2} \quad \text{Equation (3)}$$

where gmin is determined by the minimum reactive energy to achieve zero voltage switching (ZVS) and Is_full is the minimum current to achieve ZVS, Lf is the series inductance on primary side (this is represented as $L_s$ in FIG. 2), and fsa is the system maximum switching frequency. The variables V(t) and V2 is defined above.

In addition, the parameter gmax is determined by the monotonous zone of controlled variable (instantaneous transferred power vs. g_full).

In operation, controller 46 varies the switching frequency $f_s$ in real time during operation. In other words, controller 46 executing main control logic 51 (and subordinate logic modules noted above) varies the operating switching frequency of S1~S8 during real time operation. First, the switching frequency of switches S1~S8 (i.e., fs_full or sometimes referred to as $f_s$ herein) and the parameter g_full together determine the instantaneous power. In addition, the parameter g_full is defined by g_full=0.5 (gmin+gmax) as noted above. Thus, the switching frequency fs_full is determined by the instantaneous power and g_full, as in Equation (4) below:

$$\text{fs\_full}(t) := \left[ 2 \cdot |v(t)| \cdot \frac{(1 - 2 \cdot \text{w\_full}(t)) \cdot |v(t)| + 2 \cdot V2 \cdot \text{n\_full} \cdot \text{g\_full}(t)}{4 \cdot Lf \cdot \text{Ptrans\_full}(t)} \cdot (0.5 - \text{g\_full}(t)), fsa \right] \quad \text{Equation (4)}$$

In addition, it should be understood that the ZVS implementation may restrict switching frequency. In this regard, the g_full and fs_full parameters together determine transferred power. The g_full parameter is determined by ZVS, and the switching frequency is determined by the required transferred power and the g_full parameter (or ZVS). Additionally, power factor correction (PFC) requires that the transferred power from the primary side to the secondary side of the transformer to be in-phase with the input AC voltage, which is determined together by the g_full and the fs_full parameters as described above.

Gate Drive Circuit.

Figure 6A:
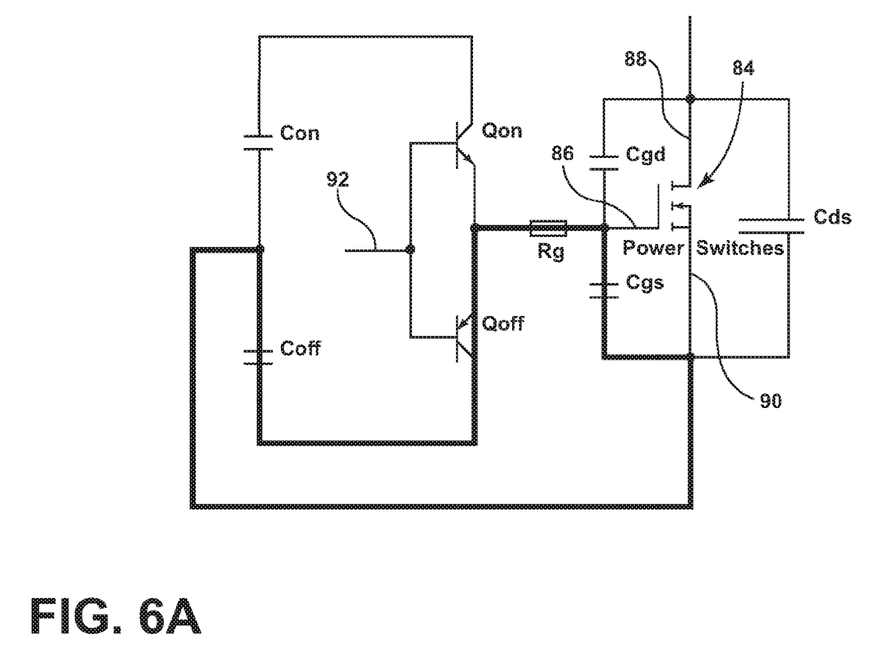
FIGS. 6A-6B are simplified, equivalent schematic circuit diagrams of a gate drive circuit showing electrical current flow during a switching on process and a switching off process, respectively.
Figure 6B:
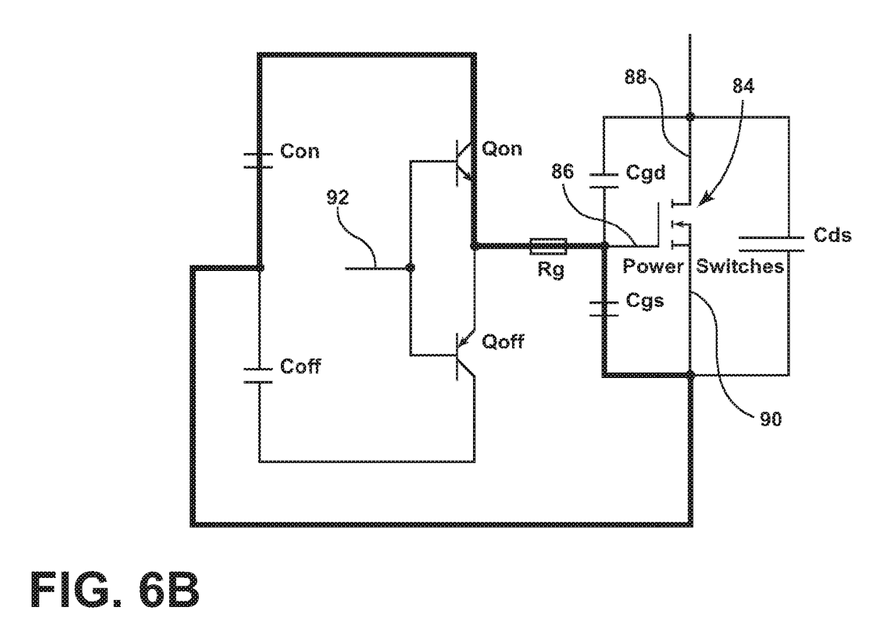

FIGS. 6A-6B are simplified, equivalent circuit diagrams of a gate drive circuit showing electrical current flow during a switching on process and a switching off process, respectively. The underlying mechanism of driving power switches is to charge or discharge an input capacitance, $C_{iss}$, of the switching device using a respective driver capacitor (i.e., as a power source).

FIG. 6A shows a power switching device 84 having a gate 86, a drain 88, and a source 90 associated therewith. Capacitances $C_{gs}$, $C_{ds}$, and $C_{gd}$ are also shown and which are associated with device 84; however, these are not separate components but rather a characteristic of the device itself— due, in part, to its construction. The gate drive circuit is modeled using a turn-on transistor $Q_{on}$ and a turn off transistor $Q_{off}$ connected in a push-pull arrangement, the push-pull arrangement being controlled by a gate control signal 92. FIG. 6A further shows capacitors $C_{on}$ and $C_{off}$ which are charged by a separate power source (not shown) and are used in the gate drive mechanism to charge and discharge the gate input capacitance. Finally, FIG. 6A shows a gate drive resistor $R_g$ coupled between an output of the gate drive circuit (i.e., the common node between the emitters of $Q_{on}$ and $Q_{off}$) and the gate 86 of the switching device 84. FIG. 6A shows, in heavy line, the electrical current path during a switching off process. As can be seen, this path includes the gate resistor $R_g$, the device $C_{gs}$, the turn-off transistor $Q_{off}$, as well as the turn-off source $C_{off}$. This circuit is substantially replicated in FIG. 6B, other than for the illustration of the electrical current path during the switching on process. As can be seen, this path also includes the gate resistor $R_g$ and the device $C_{gs}$, but differs insofar as it includes the turn-on transistor $Q_{on}$, as well as the turn-on source $C_{on}$ instead. Due to the different electrical current paths, in theory there can be different switching speed(s) that in turn means different impedance(s) of the gate-drive loop.

Figure 7:
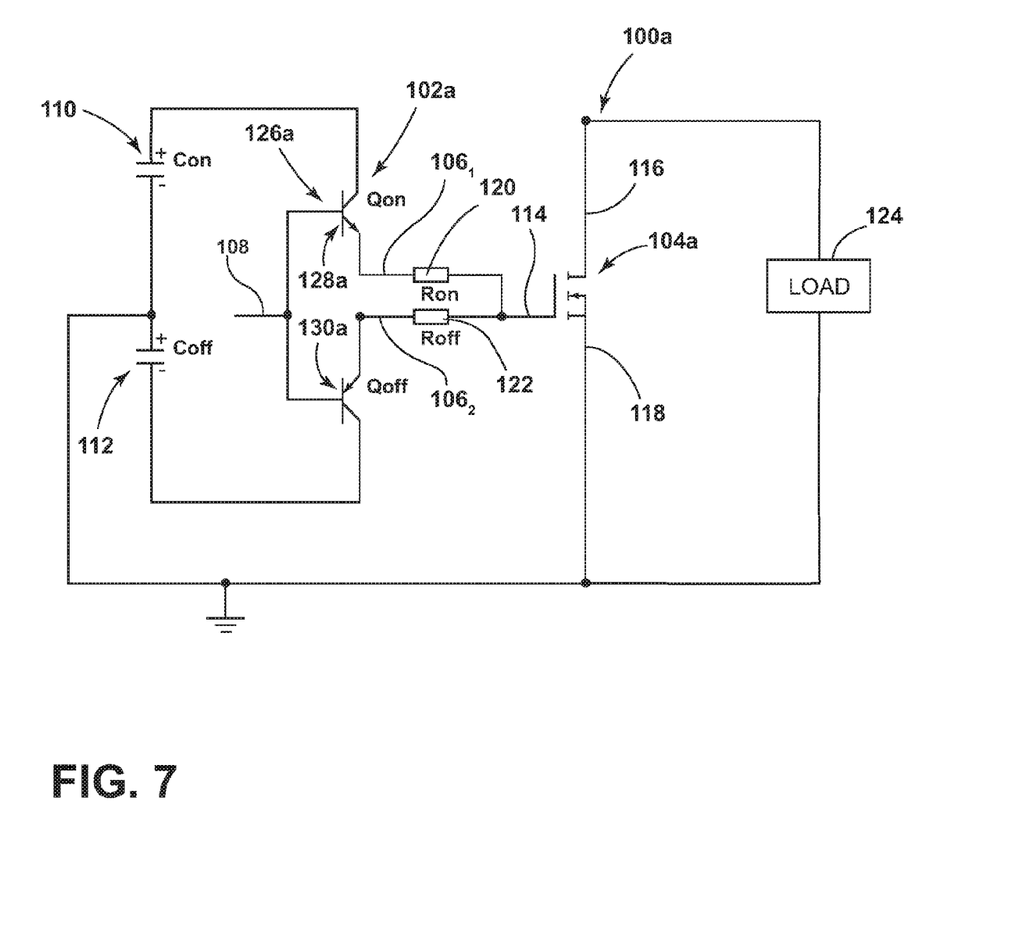
FIG. 7 is a simplified schematic diagram of a gate drive circuit embodiment according to the instant teachings.

FIG. 7 is a simplified schematic diagram of an embodiment according to the instant teachings. This embodiment provides flexibility in altering the loop different for the turn-off and turn-on processes, which in turn alter timing, switching speeds, etc. An apparatus 100a is provided which is suitable for power switching applications and which includes a gate drive circuit 102a. Gate drive circuit 102a is configured to provide separate switching on and off output timings (speeds) by including a turn-on resistor ($R_{ON}$) and a separate, potentially differently-valued turn-off resistor ($R_{OFF}$) arranged in the respective charging and discharging current paths described above in connection with FIGS. 6A-6B.

With continued reference to FIG. 7, the apparatus 100a includes gate drive circuit 102a and a wide-bandgap (WBG) switching device 104a, such an a GaN HEMT device referred to above (e.g., may comprise commercially available components, for example, an enhancement mode GaN transistor provided under the trade designation and/or part number GS66516T from GaN Systems Corp., Ann Arbor, Mich., USA.).

Gate drive circuit 102a includes at least one gate drive output 106 (i.e., two are shown in FIG. 7, designated $106_1$ and $106_2$) configured to produce at least one corresponding gate drive signal thereon in response to a gate control signal 108 applied to an input node of the gate drive circuit. The gate drive circuit 102a may also include a pair of power sources, such as a pair of capacitors designated 110 ($C_{ON}$) and 112 ($C_{OFF}$). Separate circuitry (not shown) may be provided to charge these gate driver capacitors 110, 112. The capacitors 110 ($C_{ON}$) and 112 ($C_{OFF}$) are configured to provide respective turn-on and turn-off voltages, according to the illustrated polarity.

Switching device 104a includes a gate 114, a drain 116, and a source 118 wherein the gate 114 is electrically connected to the gate drive circuit 102a through, in the illustrated embodiment, the pair of gate drive resistors, namely, a turn-on resistor 122 (also designated $R_{ON}$) and a separate, potentially differently-valued turn-off resistor 122 (also designated $R_{OFF}$). The drain 116 and the source 118 may be configured to be electrically coupled to an external circuit or circuits (e.g., a source or sources, a load or loads), shown for simplicity sake in block diagram form as a load 124. It should be appreciated, however, that the load 124 may be coupled to apparatus 100a in a variety of different ways known in the art, including being incorporated into a power conversion apparatus such as that shown and described in connection with FIGS. 1-5.

Gate drive circuit 102a may include a push-pull transistor circuit 126 comprising at least a turn-on transistor 128 ($Q_{ON}$) and a turn-off transistor 130 ($Q_{OFF}$) selected from one of (i) a pair of bipolar junction transistors (BJT), and (ii) a pair of CMOS gate-drive field-effect transistors. In the illustrated embodiment, turn-on transistor 128 ($Q_{ON}$) may comprise an NPN type bipolar junction transistor while turn-off transistor 130 ($Q_{OFF}$) may comprise a PNP type bipolar junction transistor, for example, electrically connected in an emitter follower arrangement. Alternatively, the turn-on transistor 128 ($Q_{ON}$) may comprise an NMOS type transistor while turn-off transistor 130 ($Q_{OFF}$) may comprise a PMOS type transistor.

In the illustrated embodiment, turn-on resistor 122 ($R_{ON}$) may have a first resistance and is shown coupled between turn-on transistor 128 and gate 114, while turn-off resistor 122 ($R_{OFF}$) may have a second resistance and is shown coupled between turn-off transistor 130 and gate 114. The first resistance can be different in value than the second resistance such that a turn-on (rise) time of switching device 104a may be different than a turn-off (fall) time of switching device 104a. It should be noted that the current path of the turning-on process includes $R_{on}$ (but not $R_{off}$), $C_{GS}$ (not shown in FIG. 7), $Q_{ON}$, and $C_{ON}$. It should be further noted that the current path of the turning-off process includes $R_{off}$ (but not $R_{on}$), $C_{GS}$ (not shown in FIG. 7), $Q_{OFF}$, and $C_{OFF}$. The foregoing arrangement provides improved flexibility which can be exercised to control the turn-on and turn-off speed(s) to be different.

However, when using the gate drive circuit of FIG. 7 in combination with, for example, a WBG switching device (e.g., GaN HEMTs), the switching-on/off resistors 120, 122 would typically be disposed between the BJT transistor circuit(s) and the GaN HEMT, which typically can separate or increase a physical separation of the BJT circuit from the GaN HEMT. For conventional Silicon switches, such separation will typically not affect the switching performance. However, for very fast-switching devices, such as GaN HEMTs, it is desirable to shrink the gate-drive loop to the greatest extent possible (e.g., to reduce gate-drive loop inductance to the greatest extent possible).

Figure 8A:
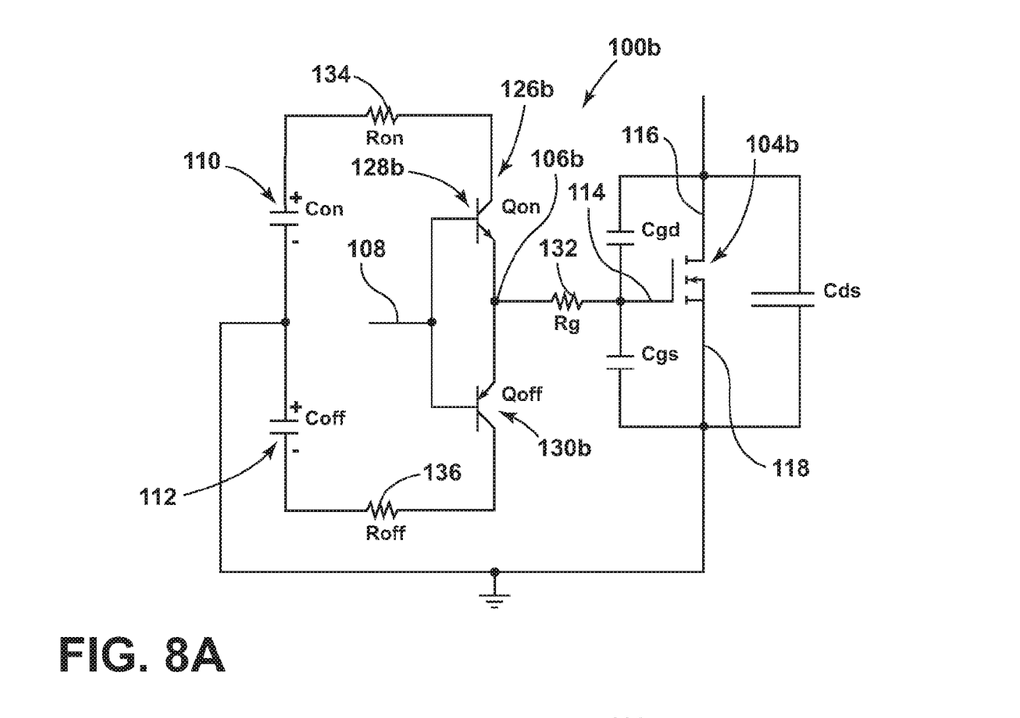
FIGS. 8A-8B are simplified schematic diagrams showing further gate drive circuit embodiments using bipolar junction transistors (BJT) and CMOS gate drive transistors, respectively.
Figure 8B:
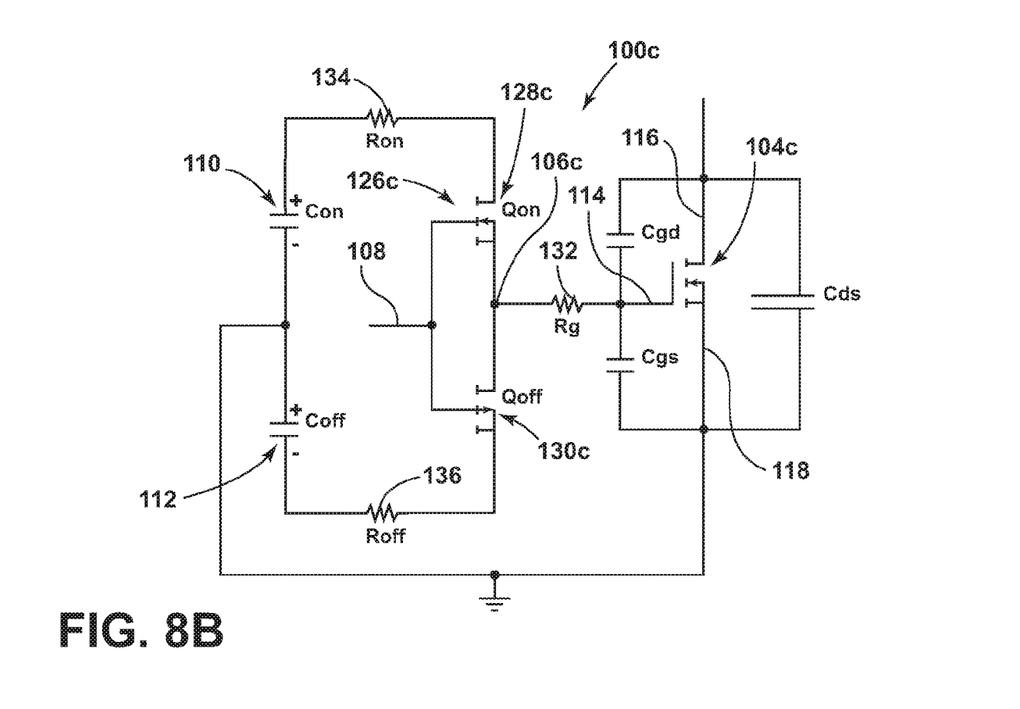

FIGS. 8A-8B are simplified schematic diagrams of further embodiments that exhibit the above-described flexibility in setting respective turn-on and turn-off speeds, but in addition, integrates the power switching device 104 with the gate drive circuit 12 so as to reduce the gate drive loop, thereby reducing gate-drive loop inductance.

FIG. 8A shows an apparatus 100b that is the same as apparatus 100a of FIG. 7 except as described below. Similar reference numerals are used in FIG. 8A as were used in FIG. 7, but which append the suffix "b" instead of the suffix "a". FIG. 8A shows a GaN switching device 104b, which may be the same as described above in FIG. 7, and which additionally shows capacitances $C_{gs}$, $C_{ds}$, and $C_{gd}$, which are associated with the device 104b itself; however, these are not separate components but rather a characteristic of the device itself—due, in part, to its construction. In addition, the turn-on and turn-off transistors are shown as BJT devices 128b, 130b, with device 128b being an NPN type BJT and device 130b being a PNP type BJT.

A single gate drive resistor 132 is provided between the output node 106b of gate drive circuit 102b and the gate 114 of the GaN device 104b. A turn-on resistor 134 ($R_{ON}$) and a separate turn-off resistor 136 ($R_{OFF}$) are provided, each having respective first and second resistance values. The turn-on resistor 134 ($R_{ON}$) is disposed between the collector of turn-on transistor 128b and the positive terminal of gate driver capacitor (power source) 110. The turn-off resistor 136 ($R_{OFF}$) is disposed between the collector of turn-off transistor 130b and the negative terminal of driver capacitor (power source) 112. It should be appreciated that, just as in FIG. 7, that the current path of the turning-on process includes $R_{on}$ (but not $R_{off}$), $R_g$, $C_{GS}$ (not shown in FIG. 7), $Q_{ON}$, and $C_{ON}$. It should be further noted that the current path of the turning-off process includes $R_{off}$ (but not $R_{on}$), $R_g$, $C_{GS}$ (not shown in FIG. 7), $Q_{OFF}$, and $C_{OFF}$. The foregoing arrangement provides improved flexibility which can be exercised to control the turn-on and turn-off speed(s) to be different.

However, unlike the embodiment of FIG. 7, the turn-on and turn-off transistors 128b, 130b, the switching device 104b and the gate drive resistor 132 ($R_g$) are all integrated, for example only, within the same integrated circuit (IC), which can significantly reduce the gate-drive loop inductance by virtue of, at least, a reduction in the distance of needed electrical interconnections. In other words, the embodiment of FIG. 8A integrates the $Q_{on}$, $Q_{off}$, $R_g$, and the GaN HEMT together to realize an IC on a chip, significantly shrinking the gate-drive-loop inductance.

It should be appreciated that the turn-on and turn-off resistors 134, 136 can be placed outside of the integrated circuit/package to thereby allow the system designer to select desired values for the resistors 134, 136, to thereby adjust the switching speed(s) as described above. The effect achieved in this embodiment is similar to FIG. 7; however, the embodiment of FIG. 8A realizes a higher level of system integration.

FIG. 8B is the same as FIG. 8A except for the use of CMOS gate-drive type transistors 128c, 130c, such as NMOS and PMOS type field effect transistors, respectively. In the context of the embodiment of FIG. 8B, the reference numerals are the same as in FIG. 8A, except for those reference numerals that include an appended suffix "c" instead of an appended suffix "b" as in FIG. 8A.

Figure 9:
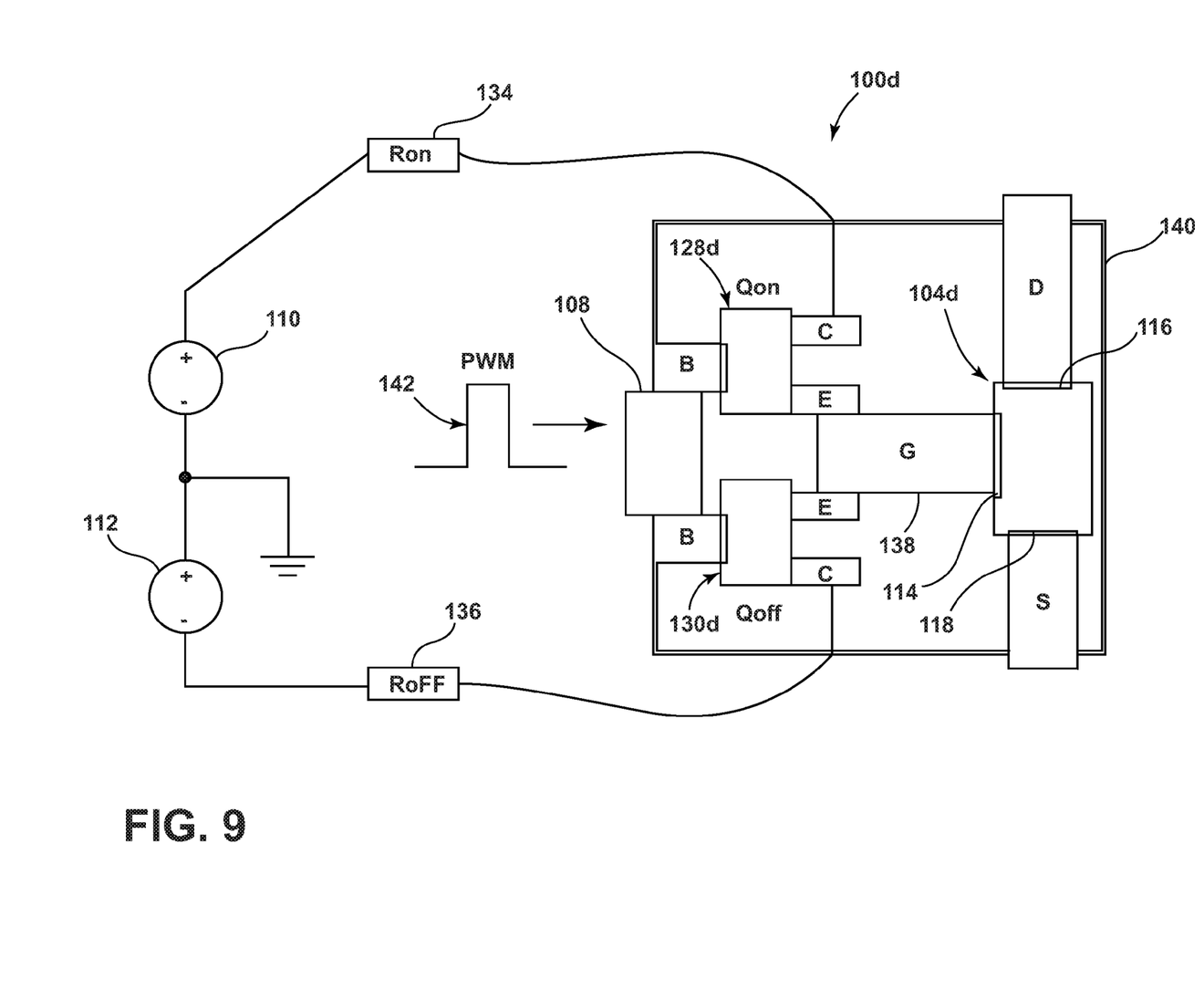
FIG. 9 is a simplified schematic and diagrammatic view of a still further gate drive circuit embodiment as implemented in an integrated circuit.
Figure 10:
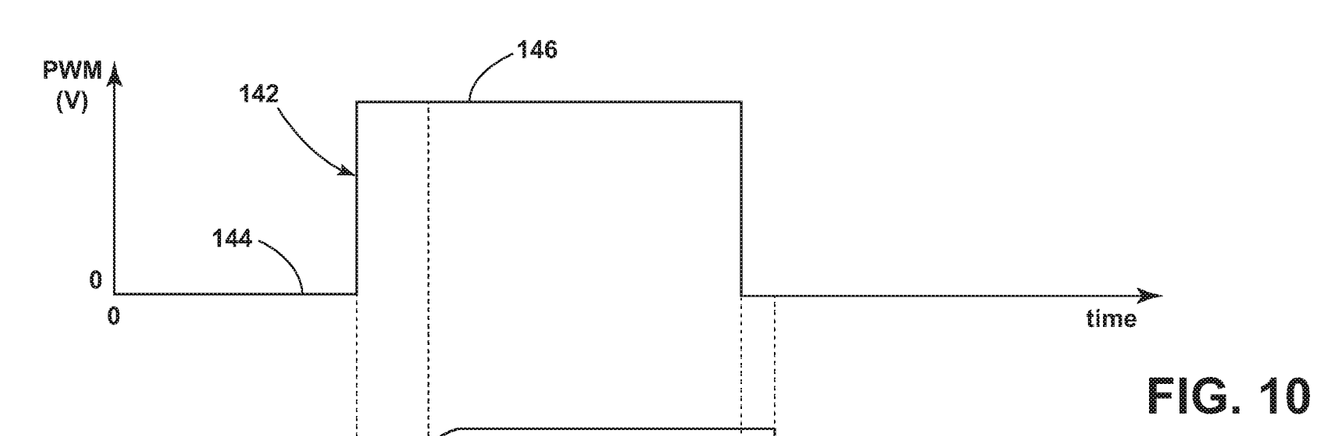
FIGS. 10-11 are timing diagrams that respectively show a gate control signal into a gate drive circuit and the resulting gate drive signal.
Figure 11:
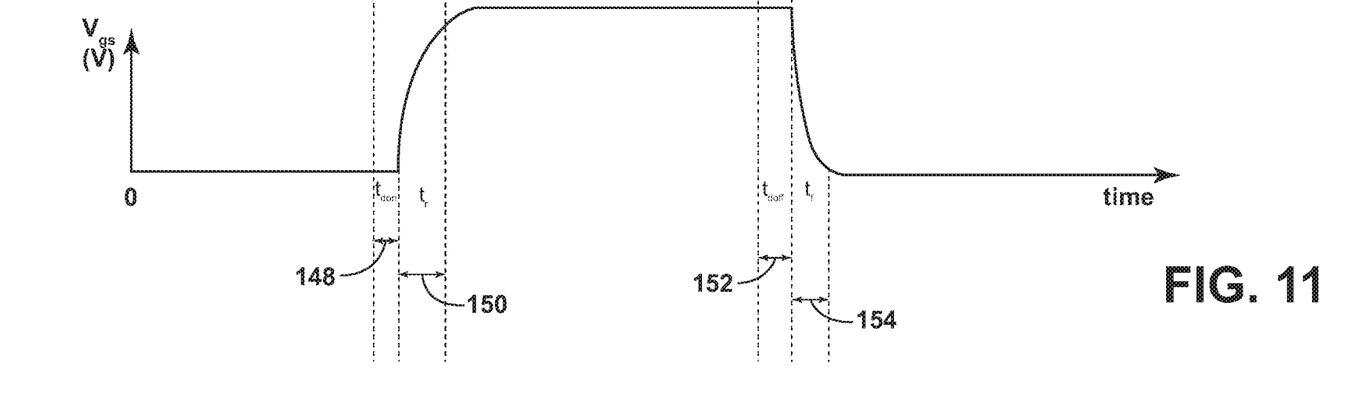

FIG. 9 is a schematic and diagrammatic view of an apparatus 100d in accordance with a further embodiment. Apparatus 100d may be the same as apparatus 100b and 100c except as stated below. In this regard, the turn-on transistor 128d (Qon), the turn-off transistor 130d (Qoff), the switching device 104d (e.g., GaN HEMT) and the gate drive resistor 138 of apparatus 100d are formed on a semiconductor die or substrate 140 and are integrated together in an integrated circuit/package. As with apparatus 100b, 100c, the turn-on transistor 128d and the turn-off transistor 130d can be implemented using either one of (i) bipolar junction transistors, such as NPN and PNP BJTs, or (ii) CMOS-gate drive field effect transistors, such as NMOS and PMOS FETs, respectively. Also, as shown, the gate drive resistor 138 may be disposed so as to directly, electrically connect the connected emitters of transistors 128d, 130d to the gate 114 of the switching device 104d. This arrangement reduces the connection distance and also reduces and/or eliminates the amount of metallic connections therebetween, so as to reduce the inductance of the gate-drive loop. FIG. 9 additionally shows a gate control signal 142, such as a pulse width modulated (PWM) signal (e.g., produced by controller 46—FIG. 2) that is illustrated as being applied to the commonly-connected base terminals of transistors 128d, 130d. This will be FIGS. 10-11 are timing diagrams showing a gate control signal and the resulting gate-to-source signal ($V_{GS}$). Specifically, FIG. 10 shows gate control signal 142, which includes at least an OFF state 144 and an ON state 146. In an embodiment, the ON state 146, when asserted, is configured to turn on the target switch, for example, the switching device 104d, while the OFF state 144, when asserted, is conversely configured to turn off the target switch 104d. As shown in FIG. 9, the gate control signal 142 is applied to the input of the gate drive circuit 26d.

FIG. 11 is aligned with FIG. 10 along the time axis and shows the resulting switching device gate-to-source voltage ($V_{GS}$). There is a time delay 148 ($t_{don}$) between the time the gate control signal 142 is asserted and the time when charging of the device input capacitance ($C_{GS}$) begins. This delay may be attributed, at least in part, to the turn-on transistor and lag before conduction starts. Thereafter, the gate-to-source voltage $V_{GS}$ experiences a voltage rise over a period of time 150 ($t_r$) corresponding to the time taken to charge input capacitance $C_{GS}$ through the $R_{ON}$ and $R_g$. When the gate control signal 142 is de-asserted, there is also a delay 152 ($t_{doff}$) attributed at least in part, to the time for the turn-on transistor 128d to turn off and the turn-off transistor 130d to turn on and start discharging. Thereafter, there is a time period 154 ($t_f$) where $V_{GS}$ falls from a high level sufficient to cause the switching device 104d to conduct, to a reduced level sufficient to turn off the switching device 104d. The time period 154 corresponds to the time to discharge $C_{GS}$ through $R_{OFF}$ and $R_g$ by way of $Q_{off}$. It should be appreciated that in the case of a WBG switching device, particularly a GaN HEMT device, that a negative gate-to-source voltage may be preferred in order to shut off the switch. Accordingly, as shown in FIG. 9 for example, a negative polarity source 112 (e.g., capacitor) is used to not only discharge $C_{GS}$ but preferably to negatively charge $C_{GS}$ such that $V_{GS}$ becomes negative, thereby ensuring a solid shut off of the GaN HEMT device.

In an embodiment, for example only, $R_{ON}$ may be 10 ohms, $R_{OFF}$ may be 1 ohm, and $R_G$ may be 1 ohm. It should be understood, however, that an advantage of the instant teachings is flexibility, and that the actual values for $R_{ON}$, $R_{OFF}$, and $R_G$ Ron, may vary significantly, depending on the timing/speed objections of any particular application.

Embodiments consistent with the present teachings realize an integrated gate drive circuit and power switching device, such as a WBG switching device (e.g., GaN HEMT) that reduces the gate-drive loop inductance. This has a number of benefits, including at least reducing ringing on the switching device gate terminal. This will reduce the gate-loop inductance, and meanwhile allow a user to adjust the switching speed by changing the $R_{on}$ and $R_{off}$ values freely, particularly for GaN devices which are very sensitive to the external loop inductance. Embodiments consistent with the present teachings therefore provide improved flexibility in adjusting switching speed(s), for example, by allowing separate turn-on and turn-off speeds.

It should be understood that an electronic control unit as described herein may include conventional processing apparatus known in the art, capable of executing pre-programmed instructions stored in an associated memory, all performing in accordance with the functionality described herein. To the extent that the methods described herein are embodied in software, the resulting software can be stored in an associated memory and can also constitute the means for performing such methods. Implementation of certain embodiments, where done so in software, would require no more than routine application of programming skills by one of ordinary skill in the art, in view of the foregoing enabling description. Such an electronic control unit may further be of the type having both ROM, RAM, a combination of non-volatile and volatile (modifiable) memory so that any software may be stored and yet allow storage and processing of dynamically produced data and/or signals.

Although only certain embodiments have been described above with a certain degree of particularity, those skilled in the art could make numerous alterations to the disclosed embodiments without departing from the scope of this disclosure. It is intended that all matter contained in the above description or shown in the accompanying drawings shall be interpreted as illustrative only and not limiting. Changes in detail or structure may be made without departing from the invention as defined in the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

While one or more particular embodiments have been shown and described, it will be understood by those of skill in the art that various changes and modifications can be made without departing from the spirit and scope of the present teachings.

What is claimed is:

1. An apparatus comprising:
   a gate drive circuit having at least one gate drive output configured to produce a gate drive signal on said gate drive output in response to a gate control signal on an input thereof;
   a wide-bandgap (WBG) switching device having a gate, a drain, and a source wherein said gate of said WBG switching device is electrically connected to said gate drive circuit through a gate drive resistor, said drain and said source being configured to be electrically coupled to a load;
   wherein said gate drive circuit includes a push-pull transistor circuit comprising at least a turn-on transistor and a turn-off transistor selected from one of (i) a pair of bipolar junction transistors (BJT), and (ii) a pair of CMOS gate-drive field-effect transistors, said gate drive circuit further including a turn-on resistor having a first resistance coupled to said turn-on transistor and a turn-off resistor having a second resistance coupled to said turn-off transistor,
   wherein said turn-on transistor, said turn-off transistor, said gate drive resistor, and said WBG switching device are formed on a common substrate, said turn-on resistor and said turn-off resistor are not disposed on said common substrate, said common substrate is disposed in an integrated circuit package.

2. The apparatus of claim 1 wherein said turn-on transistor and said turn-off transistor respectively comprise an NPN transistor and a PNP transistor, said NPN transistor and said PNP transistor being arranged in an emitter-follower configuration wherein a first emitter of said NPN transistor is connected to a second emitter of said PNP transistor at a common node defining said gate drive output.

3. The apparatus of claim 2 wherein common node is directly electrically connected to said gate drive resistor.

4. The apparatus of claim 3 wherein said gate drive resistor is directly electrically connected to said gate of said WBG switching device.

5. The apparatus of claim 2 wherein said turn-on resistor is electrically connected between a collector terminal of said NPN transistor and a power source.

6. The apparatus of claim 5 wherein said power source comprises a positive polarity power source.

7. The apparatus of claim 2 wherein said turn-off resistor is electrically connected between a collector terminal of said PNP transistor and a power source.

8. The apparatus of claim 7 wherein said power source comprises a negative polarity power source.

9. The apparatus of claim 2 wherein respective gate terminals of said NPN transistor and said PNP transistor are electrically connected at an input node defining said gate drive circuit input on which said gate control signal is applied.

10. The apparatus of claim 1 wherein said WBG switching device comprises a high electron mobility transistor (HEMT).

11. The apparatus of claim 10 wherein said HEMT comprises a GaN high electron mobility transistor (HEMT) device.

12. The apparatus of claim 11 wherein a switching speed of said WBG switching device is in a MHz range.

13. The apparatus of claim 1 wherein said gate control signal comprises a pulse width modulated (PWM) signal.

14. The apparatus of claim 1 wherein said turn-on transistor and said turn-off transistor respective comprise NMOS and PMOS field effect transistors.

15. The apparatus of claim 1 further comprising an electronic control unit configured to control said gate drive circuit in accordance with a zero voltage switching (ZVS) strategy.

16. The apparatus of claim 15 wherein said electronic control unit is configured to control said gate drive circuit in accordance with said ZVS strategy when transitioning said gate drive signal from said off state to said on state.

17. The apparatus of claim 1 wherein said gate drive circuit and said WBG switching device are used in a bridge circuit.

18. The apparatus of claim 1 wherein said first resistance is different than said second resistance such that a turn-on speed of said WBG switching device is different than a turn-off speed of said WBG switching device.

* * * * *